(12) United States Patent
Sherrer et al.

(10) Patent No.: US 7,294,280 B2
(45) Date of Patent: Nov. 13, 2007

(54) EXTERNAL CAVITY SEMI-CONDUCTOR LASER AND METHOD FOR FABRICATION THEREOF

(75) Inventors: David W. Sherrer, Blacksburg, VA (US); Hui Luo, Markham (CA)

(73) Assignee: Shipley Company, L.L.C., Marlborough, MA (US)

( * ) Notice: Subject to any disclaimer, the term of this patent is extended or adjusted under 35 U.S.C. 154(b) by 542 days.

(21) Appl. No.: 10/860,810

(22) Filed: May 24, 2004

(65) Prior Publication Data

US 2004/0258107 A1 Dec. 23, 2004

Related U.S. Application Data

(60) Provisional application No. 60/472,914, filed on May 23, 2003, provisional application No. 60/472,873, filed on May 23, 2003, provisional application No. 60/472,692, filed on May 23, 2003.

(51) Int. Cl.
*B29D 11/00* (2006.01)
(52) U.S. Cl. .............................. 216/24; 216/2; 216/41; 216/83
(58) Field of Classification Search .................... 216/2, 216/24, 41, 83
See application file for complete search history.

(56) References Cited

U.S. PATENT DOCUMENTS

| | | | |
|---|---|---|---|
| 3,853,650 A | 12/1974 | Hartlaub | |
| 3,893,228 A | 7/1975 | George et al. | |
| 4,203,128 A | 5/1980 | Guckel et al. | |
| 4,234,361 A | 11/1980 | Guckel et al. | |
| 4,446,543 A | 5/1984 | McLandrich et al. | |
| 4,550,410 A | 10/1985 | Chenausky et al. | |
| 4,597,003 A | 6/1986 | Aine et al. | |
| 4,682,500 A * | 7/1987 | Uda | 73/705 |
| 4,779,959 A | 10/1988 | Saunders | |
| 4,787,691 A | 11/1988 | Lorenzo | |
| 4,825,262 A * | 4/1989 | Mallinson | 356/454 |
| 4,926,696 A | 5/1990 | Haritonidis et al. | |
| 4,933,545 A | 6/1990 | Saaski et al. | |
| 4,942,767 A | 7/1990 | Haritonidis et al. | |
| 5,022,745 A | 6/1991 | Zayhowski et al. | |
| 5,068,749 A | 11/1991 | Patel | |
| 5,077,747 A | 12/1991 | Hemmer | |

(Continued)

FOREIGN PATENT DOCUMENTS

EP 0 668 490 9/1999

(Continued)

OTHER PUBLICATIONS

European Search Report of correspoonding European Application No. EP 04 25 2984, filed May 21, 2004.

(Continued)

*Primary Examiner*—Shamim Ahmed
(74) *Attorney, Agent, or Firm*—Jonathan D. Baskin

(57) ABSTRACT

The present invention concerns a design for an external cavity single mode laser wherein a short optical path length for the optical cavity (e.g., ~3 to 25 mm) provides sufficient spacing of the longitudinal modes allowing a single wavelength selective element, such as a microfabricated etalon, to provide a single mode of operation, and optionally a selectable mode of operation.

9 Claims, 11 Drawing Sheets

U.S. PATENT DOCUMENTS

| | | |
|---|---|---|
| 5,132,824 A | 7/1992 | Patel |
| 5,144,498 A | 9/1992 | Vincent |
| 5,150,236 A | 9/1992 | Patel |
| 5,191,587 A | 3/1993 | Hanson e |
| 5,218,610 A | 6/1993 | Dixon |
| 5,247,490 A | 9/1993 | Goepel et al. |
| 5,321,539 A | 6/1994 | Hirabayashi et al. |
| 5,381,231 A | 1/1995 | Tu |
| 5,408,319 A | 4/1995 | Halbout et al. |
| 5,425,115 A | 6/1995 | Wagner |
| 5,428,635 A | 6/1995 | Zhiglinsky |
| 5,446,815 A | 8/1995 | Ota et al. |
| 5,463,647 A | 10/1995 | Pan |
| 5,481,632 A | 1/1996 | Hirai et al. |
| 5,499,261 A | 3/1996 | Welch |
| 5,513,290 A | 4/1996 | Ishikawa et al. |
| 5,561,523 A * | 10/1996 | Blomberg et al. .......... 356/454 |
| 5,600,070 A | 2/1997 | Wlodarczyk |
| 5,619,046 A | 4/1997 | Engstrom et al. |
| 5,654,819 A | 8/1997 | Goossen et al. |
| 5,739,945 A | 4/1998 | Tayebati |
| 5,920,391 A | 7/1999 | Grasdepot et al. |
| 5,943,155 A | 8/1999 | Goossen |
| 5,953,155 A | 9/1999 | Eckel, Jr. et al. |
| 6,085,002 A | 7/2000 | Qiu et al. |
| 6,115,401 A | 9/2000 | Scobey et al. |
| 6,118,917 A | 9/2000 | Lee et al. |
| 6,205,159 B1 | 3/2001 | Sesko et al. |
| 6,218,661 B1 | 4/2001 | Schroeder et al. |
| 6,281,976 B1 | 8/2001 | Taylor et al. |
| 6,282,215 B1 | 8/2001 | Zorabedian et al. |
| 6,324,192 B1 | 11/2001 | Tayebati |
| 6,373,632 B1 * | 4/2002 | Flanders ..................... 359/578 |
| 6,381,022 B1 | 4/2002 | Zavracky |
| 6,738,145 B2 | 5/2004 | Sherrer et al. |
| 6,768,590 B2 | 7/2004 | Steinberg et al. |
| 2002/0012172 A1 | 1/2002 | Steinberg et al. |
| 2002/0136104 A1 | 9/2002 | Daiber |

FOREIGN PATENT DOCUMENTS

| | | |
|---|---|---|
| WO | WO 01/29937 | 4/2001 |
| WO | WO 01/67156 | 9/2001 |
| WO | WO 03/023463 | 3/2003 |

OTHER PUBLICATIONS

Sidorin et al., "Demonstration of a Tunable Hybrid Laser Diode Using an Electrostatically Tunable Silicon Micromachined Fabry-Perot Interferometer Device", IEEE Photonics Technology Letters, IEEE Inc. New York, US, vol. 11, No. 1, Jan. 1999, pp. 18-20.

Hecht Optics Second Edition, Eugene Hecht, reprinted 1990, reference text, pp. 303 & 368-372.

* cited by examiner

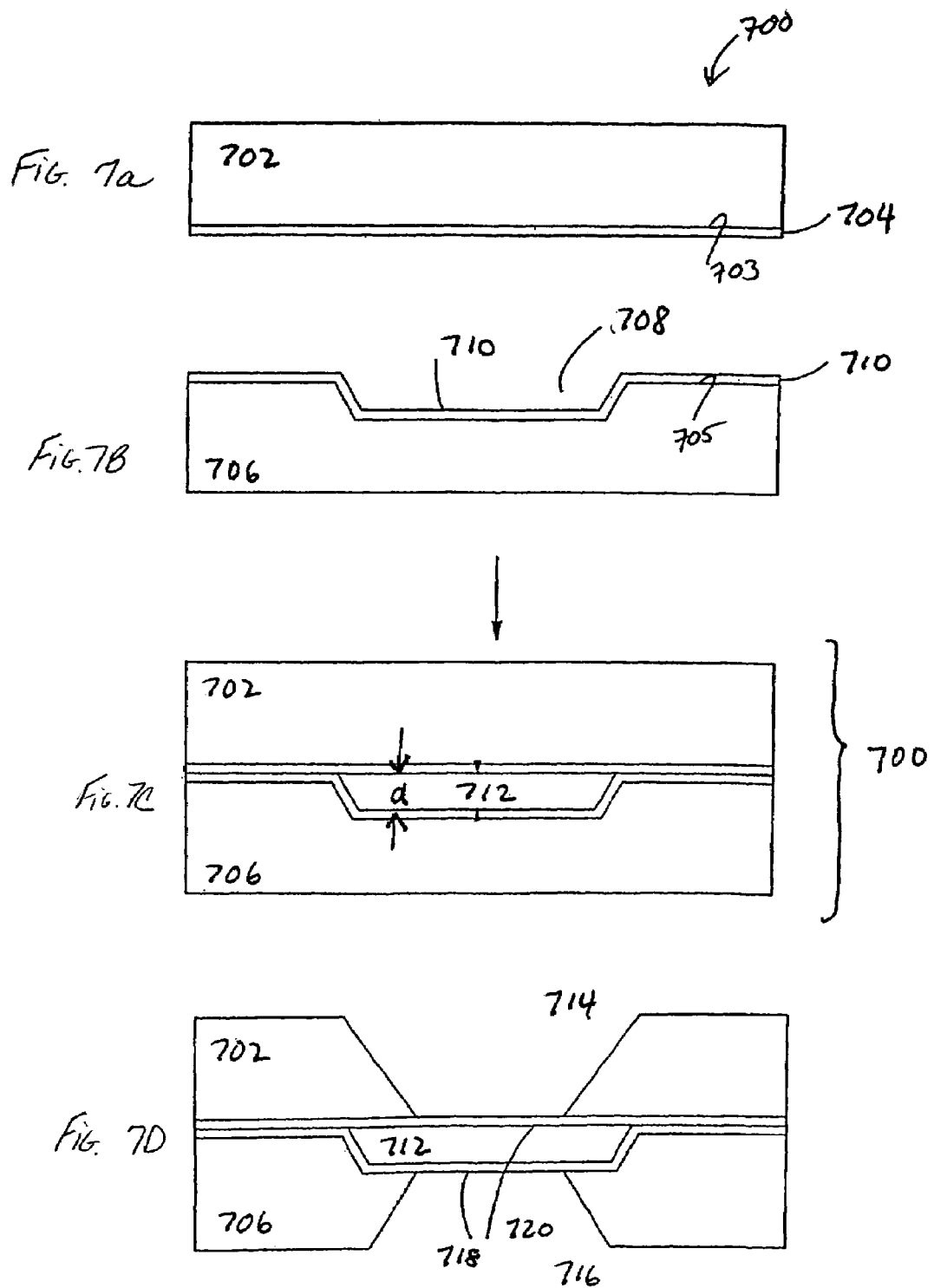

EXTERNAL CAVITY SEMI-CONDUCTOR LASER AND METHOD FOR FABRICATION THEREOF

RELATED APPLICATIONS

This application claims the benefit of U.S. Provisional Application Ser. No. 60/472,914, filed May 23, 2003; U.S. Provisional Application Ser. No. 60/472,873, filed May 23, 2003; and U.S. Provisional Application Ser. No. 60/472,692, filed May 23, 2003, the entire contents of which applications are incorporated herein by reference.

FIELD OF INVENTION

The invention relates generally to lasers optically coupled to external optical cavities, and specifically to laser diodes that can be tuned by selecting a particular emission wavelength from a set of discrete emission wavelengths that are characteristic of the coupled laser and external optical cavity. More particularly, the invention relates to micromachined Fabry-Perot etalons used in external cavity laser systems to select a desired laser emission mode, as proves useful in wavelength-division multiplexing (WDM) optical fiber communications systems.

BACKGROUND

Fiber optic communications systems, such as those used pervasively in telecommunications, are comprised of three basic components: a transmitter/light-source, an optical fiber link or channel, and a detector/receiver. Such systems gain most of their advantage with regard to data transmission capacity, speed and distance if a laser—as opposed to a light-emitting diode (LED)—is used as the light source; and accrue further benefits with respect to cost, compactness, reliability, and power consumption if a semiconductor laser diode in particular is used as the transmitter light source.

Although a laser is nominally a monochromatic light source, a laser will in fact generally produce light at several emission wavelengths (referred to as modes), unless steps are taken to suppress all but one of the modes, in which case the laser is referred to as a single-mode laser. Such single-mode lasers provide superior performance in optical fiber systems on account of reduced dispersion losses, which in turn permits higher data rates and longer transmission distances.

The transmission capacity and functionality of a fiber optic link can be increased considerably by the technique of wavelength-division multiplexing (WDM). In general, multiplexing refers to the simultaneous transmission of several signals or messages on the same circuit or channel. For example, in coaxial cable systems frequency-division multiplexing is realized by providing several independent carrier signals, each with a distinct frequency assignment, and each modulated with an independent message signal. At the receiving end of the coaxial cable, selective bandbass filters separate the several carrier frequencies so that each carrier can be demodulated to yield the original message signals. As another example, in digital data transmission systems time-division multiplexing is effected by interleaving bit streams from several sources to form a composite high-rate bit stream. At the receiving end, the bit streams can be demixed with proper considerations of time frames and synchronizations.

An analogous multiplexing technique, called wavelength division multiplexing (WDM), is used in fiber optic communications systems. WDM is based on simultaneous transmission of light signals that are allocated to different carrier wavelengths. Several lasers with discrete and well-separated emission wavelengths are independently modulated by several message signals. The allocated carrier wavelengths of a WDM system are referred to as 'channels'. The modulated laser outputs are all launched into a common optical fiber, and are de-multiplexed at the receiving end of the link by wavelength-sensitive filters. Signals thus separated according to their carrier wavelength are coupled to detectors dedicated to a particular channel wavelength assignment. Fiber optic systems employing WDM are now a well-established part of the telecommunications infrastructure.

A wavelength division multiplexing system requires at least several—sometimes as many as 50 to 100—laser transmitters, each operating at a distinct emission wavelength. Since the emission wavelength is, to a large extent, an intrinsic property of a conventional laser, a WDM system would seemingly require several or more different types of laser diodes, each with a specified emission wavelength. On the contrary, the preferred implementation of WDM systems is to instead use just one type of laser, but one which can be readily adjusted and set by the user to operate at any of several prescribed available emission wavelengths. Such lasers are referred to as 'tunable' in that the emission wavelength according to the specific application and system requirements can be adjusted in the field. In WDM fiber optics systems with multiple channels, each channel transmitter would use the same type of laser, but with its singular emission wavelength tuned to and set for the wavelength allocated for that particular channel. This approach, namely, employing just one kind of tunable laser rather than many different kinds of single-mode lasers with unique emission wavelengths, addresses what is commonly known as the provisioning problem, as it considerably simplifies the inventory, deployment, assembly, and maintenance of a WDM system. For example, rather than stock, install, and maintain many different types of lasers, a generic tunable laser is used for all transmitter light sources, and its emission wavelength is selected according to where it is inserted into the WDM system. The use of tunable laser diodes also facilitates reconfiguration of WDM systems, as transmitters can be readily re-assigned to new channels by selecting a new emission wavelength. Hence, providing an apparatus to realize mode switching of a compact external cavity laser, and especially one of simplified construction, is useful for WDM optical communications systems would provide an important advance in the field of laser technology.

SUMMARY

The present invention also provides an external cavity semi-conductor laser, comprising: a laser gain medium for providing a source of optical radiation; an external optical cavity disposed in optical communication with the gain medium, the cavity dimensioned sufficiently short to permit a single wavelength selective device to select and sustain a single longitudinal lasing mode; and a single wavelength selective device disposed in the external optical cavity to select and sustain a single longitudinal lasing mode. In one desirable configuration the wavelength selective device comprises a microfabricated etalon. For example, the invention provides a microfabricated etalon, comprising: a crystalline substrate having first and second opposing surfaces; a spacer layer disposed over the first surface of the substrate, the spacer layer having an exterior surface; a hole extending through the substrate from the first surface to the second surface, the hole having a base adjacent an exposed portion of the spacer layer; and a first interference filter disposed on the exterior surface of the spacer layer and a second interference filter disposed on the exposed portion of the spacer layer to provide an etalon between the interference filters.

The present invention also provides a method for fabricating a microfabricated etalon, comprising: providing a crystalline substrate having first and second opposing surfaces; providing a spacer layer over the first surface of the substrate, the spacer layer having an exterior surface; forming a hole extending through the substrate from the first surface to the second surface, the hole having a base adjacent an exposed portion of the spacer layer; and providing a first interference filter on the exterior surface of the spacer layer and providing a second interference filter on the exposed portion of the spacer layer to provide an etalon between the interference filters.

BRIEF DESCRIPTION OF THE FIGURES

FIGS. 7a-7d schematically illustrate an alternative embodiment of a micromachined etalon comprised of substrate coated on one side with a thin multilayer dielectric stack (7a), another substrate with a beveled depression and also coated with a multilayer dielectric stack on one side (7b), a composite structure formed by bonding together said substrates (7c), and the formation of recesses on both sides of said composite (7d).

DETAILED DESCRIPTION OF THE INVENTION

Figure 1:
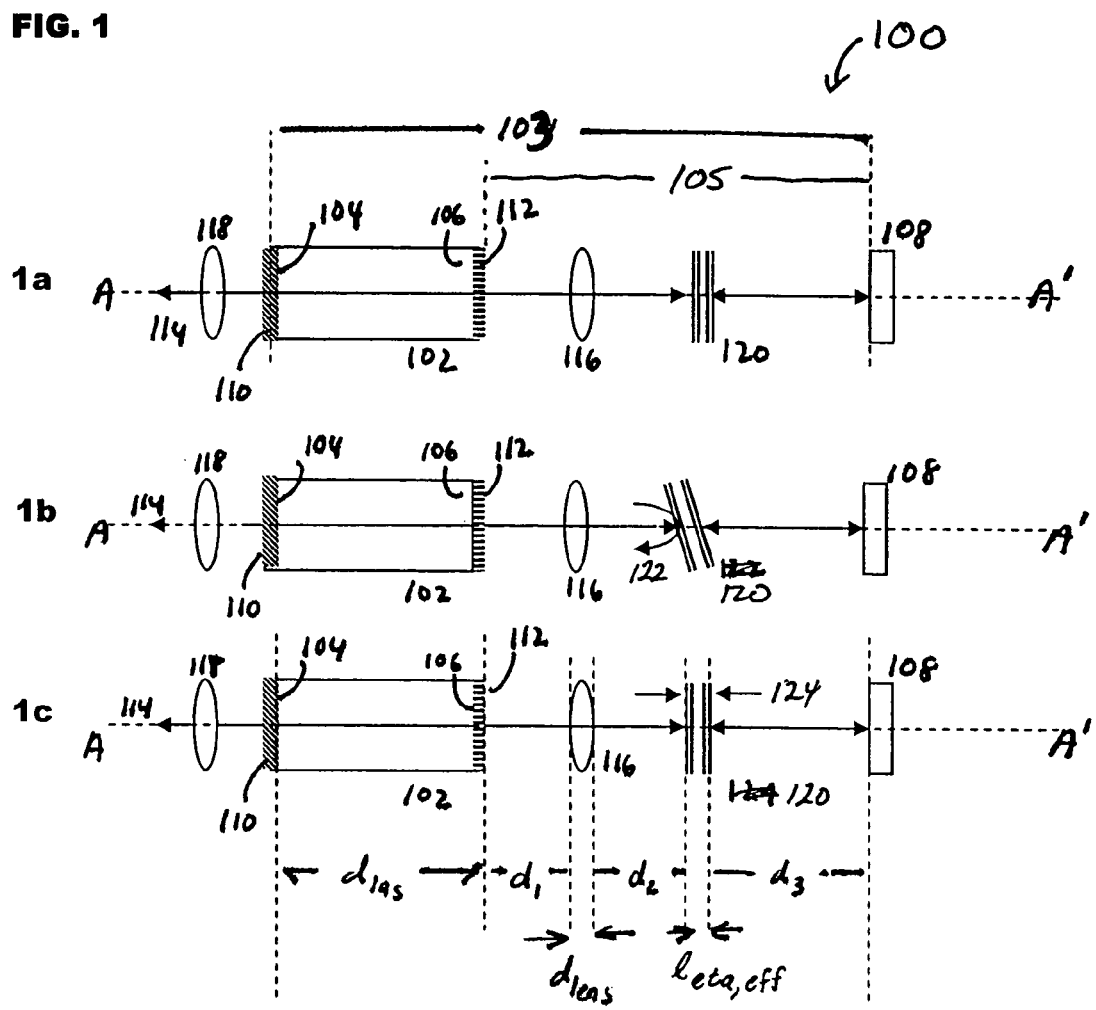
FIGS. 1a-1c schematically illustrates various implementations of an external cavity laser using an etalon in accordance with the present invention as a mode-filtering or mode selecting device including 1a with a static etalon, 1b with a tiltable etalon, and 1c with a variable-gap etalon.

The present invention concerns a design for an external cavity single mode laser 100 wherein a short optical path length for the optical cavity 103 (~3 to 25 mm) provides sufficient spacing of the longitudinal modes allowing a single wavelength selective element, such as a microfabricated etalon 120, to provide a single mode of operation, and optionally a selectable mode of operation. The total path length of the laser optical cavity 103 is the path length between reflectors 108, 110 of the laser cavity 103, typically one reflector 110 comprising a coating on an external facet of a lasing element 102 and one reflector 108 being an external mirror. The microfabricated etalon 120 is a wavelength-sensitive device comprising a pair of reflective surfaces, such as thin-film multilayer dielectric stacks 202, 204, separated by a transparent slab or an air gap 124, which can be used to selectively transmit or reflect light of specified wavelengths. Thus, the etalon 120 is used to preferentially suppress or sustain lasing modes in the optical cavity 103.

The external cavity laser 100 is configured to cooperate with the etalon 120 so that the microfabricated etalon 120 can switch the laser output between the several or more discrete-wavelength emission modes defined by the total path length of laser optical cavity 103. The etalon 120 can be tuned, i.e., its wavelength-dependent transmission characteristics can be modified, by changing the angle at which light is incident on the etalon, e.g., tilting the etalon 120. Alternatively, the etalon may be designed with a variable air gap spacing that can be tuned by changing the etalon gap width between the multilayer dielectric stacks 202, 204. For example, the etalon 120 can be tuned by a voltage control signal applied to electrodes formed on the etalon 120 to vary the air gap spacing. The small size of the micromachined etalon 120 permits a comparatively reduced external optical cavity length, which, in turn, results in more widely spaced laser modes making mode selection more readily accomplished by an etalon of simple design. Since the modes are more widely spaced, the filtering demands on the etalon 120 are reduced (the pass bandwidth need not be as narrow), thus further facilitating use of the micromachined etalon disclosed herein for laser mode selection.

The present invention further concerns the ability to use a wavelength selective element to discreetly mode hop between longitudinal modes of the laser cavity 103, and therefore allow a mechanism as simple as counting the hops between lasing and non-lasing states from a reference or "home" wavelength to determine a change in operating wavelength.

Referring now to the figures, in which like elements are numbered alike throughout, and in particular FIGS. 1A-1C, three exemplary configurations of the invention are shown. An external optical cavity laser 100 is provided comprising optical and optoelectronic components dispersed along a common optical axis A-A'. The optical source comprises lasing element 102 which may be an optical gain material/medium or combination of optical materials that exhibits optical gain, and as such is conducive to stimulated radiative emission in optically-confined waveguide or cavity modes. For example, the lasing element 102 may comprise an electrically-biased, edge-emitting semiconductor diode laser for use with WDM optical fiber systems. Other types of lasers, such as surface-emitting lasers, including vertical cavity surface emitting lasers (VCSELs), may also be used. Suitable laser media may include various compound semiconductors including alloys of InP, GaAs, and InAs. The lasing element 102 is optically coupled to an external optical cavity 105 oriented longitudinally along optical axis A-A'. The combination of the length of the lasing element 102 plus the length of the external cavity 105 defines a total optical cavity length 103. The optical path length, which determines the spacing of longitudinal modes if found by the sum of the products of the physical path lengths along A-A' of each physical element and its effective refractive index at the wavelength of concern. The gaps between elements are also included in the calculation where the index may be ~1.0 for air, or otherwise if an optical encapsulant consumes the space. The lasing element 102 is bound by a first end surface 104 and a second end surface 106, both of which are normal to the optical axis A-A'. If the lasing element 102 is formed on a monocrystalline specimen, the end surfaces 104 and 106 can be formed by cleaving the crystal to expose flat, parallel surfaces, referred to as edge facets.

The optical cavity 103 is formed by two reflectors 110, 108 positioned along the axis A-A' and within which the lasing element 102 is disposed. The optical cavity 103 comprises a cavity portion internal to the lasing element 102 and an exterior cavity portion 105. The distal reflector 108 may be a separate mirror external to the lasing element 102 to define one end of the cavity. The plane of the reflector 108 is desirably oriented so that it is normal to the optical axis A-A'. The other end of the optical cavity, opposite to the end defined by the reflector 108, is defined by a reflector that may be provided as a reflective coating 110 formed on the first surface 104 of the lasing element 102. The second lasing element surface 106, which also may be an edge facet, may be coated with an anti-reflection coating 112 to prevent reflection at the second surface 106 so that a resonating cavity is not provided between the first and second end surfaces 104, 106 of the lasing element 102.

In operation, the laser media is pumped electrically by injection of minority carrier in a p-n junction, or optically by absorption of light, either of which results in a non-equilibrium distribution of charge carriers. In this state, the laser material can exhibit optical gain whereby the absorption of photons in a certain spectral gain bandwidth range leads to stimulated emission of photons. Lasing is due to the excess charge carriers associated with the non-equilibrium conditions then recombine to emit photons, some of which are confined within the optical cavity 103 by the reflector 108 and reflective coating 110. A fraction of such light emission is of certain wavelengths and propagation directions (collectively called modes) such that constructive interference effects due to the optical cavity 103 provide sufficient feedback so that laser oscillation modes can be sustained. In actuality, reflective coating 110 is not perfectly reflective so that a portion of the photons produced by stimulated emission are transmitted through end surface 104 and coating 110 out of the optical cavity 103. This light constitutes the laser output beam 114. Other structures for external cavity lasers which are known can be employed, for example both surfaces of the semiconductor lasing element 102 can be AR coated and two external mirrors employed, alternatively the facet mirror may reflect most of the light and the external mirror 108 can be used with a lesser reflector to out couple from the system.

As the optical cavity 103 can generally support multiple modes and as the laser has a finite gain bandwidth, the laser 100 will emit light at several wavelengths. The allowed multi-mode laser emission wavelengths are determined by the effective optical length of the cavity 103: as the optical cavity length is decreased, the laser 100 exhibits fewer, more widely-spaced emission wavelength modes. The optical cavity modes are the modes of the total optical cavity length 103 between reflectors 108, 110, on one end being the facet coating 110 and the other end being an external cavity mirror 108. Thus the optical cavity modes include the optical path length of the lasing element 102 and the optical path length of the external cavity 105, combined. For WDM applications, it is useful to reduce the laser emission to a single mode, and further to have the capability of selecting the particular single emission mode.

The external optical cavity 105 may contain other optical components, such as a lens 116, to sufficiently collimate or focus the light from the semiconductor lasing element 102, allowing it to propagate to through the etalon 120, reflect from the reflector 108, and return to the lasing element 102 with suitably low loss that net laser gain can achieved allowing laser action. Other structures can achieve this such as a curved mirror for reflector 108, or a combination of lenses and curved mirrors. Additional optional components may include filters, gratings, prisms, and the like. Still other optical components, such as for example a collimating lens 118 that collimates the laser output, may be positioned exterior to the optical cavity 103.

For example, FIG. 1a shows a micromachined etalon 120 in accordance with the present invention disposed in the external optical cavity along optical axis A-A'. The micromachined etalon 120 can be used to eliminate a subset of the allowable laser modes. Basically, the micromachined etalon 120 spoils the resonant condition of optical cavity modes characterized by wavelengths for which the etalon 120 is not transmissive. Modes with wavelengths for which the micromachined etalon 120 is transmissive are sustained. Desirably, the micromachined etalon 120 is configured to permit only a single (selectable) laser cavity mode to resonate, which configuration is made possible by the fabrication process in accordance with the present invention set forth below.

Turning to the mode selection aspect of the present invention, as illustrated in FIG. 1b, the micromachined etalon 120 can be tilted, thus modifying the angle of incidence and therefore its spectral transmission characteristics with respect to the cavity modes, with the effect that the mode(s) selected for sustained lasing action can be changed. Alternatively, FIG. 1c illustrates that the micromachined etalon 120 may comprise an air or vacuum gap 124 which can be varied to modify the spectral transmission characteristics of the micromachined etalon 120, and through which particular laser modes of the optical cavity 103 can be selected.

As thus elaborated, the external-cavity laser 100 can function as an optical source for which a user can select a single, narrow-band emission wavelength from among a multitude of available discrete emission wavelength bands defined largely by the cavity length.

In accordance with the present invention, a substantial reduction in component complexity of the tunable laser 110 is realized, because the optical cavity 103 has a comparatively short optical path length, so that the longitudinal modes are relatively widely spaced. In turn, tuning the laser output by means of mode selection can be effected by using a relatively simple wavelength-discriminating device such as a micromachined etalon 120, which for example, can comprise relatively fewer dielectric layers than a typical interference filter. Moreover, the simplification afforded by selection and filtering of wider-spaced emission wavelengths due to a shorter external optical cavity length permits elimination of auxiliary components and devices as commonly found in conventional WDM laser systems. For example, a typical tunable laser often requires several complex feedback mechanisms including a piezo adjustable cavity length, thermal tuning, and a tunable grating or other filter each with control loops providing information to maintain a single known frequency. The present invention to provides a simpler feedback mechanism where for example, if the temperature of the system is fixed, the longitudinal mode positions are then known with sufficient accuracy to allow a simple tunable element to select the desired mode by discreetly counting the hops from longitudinal mode to longitudinal mode via the modulation in optical power observed during tuning.

Figure 2:
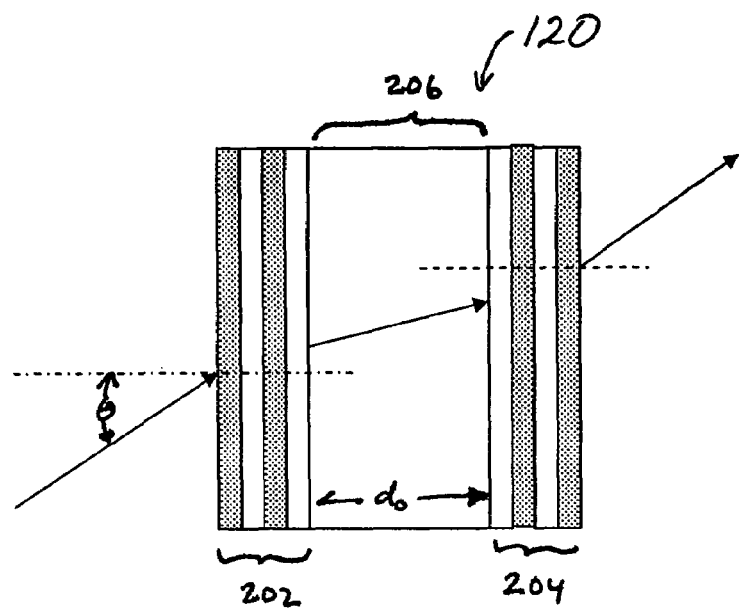
FIG. 2 schematically illustrates a conventional etalon comprised of a dielectric slab coated on both sides with multilayer dielectric stacks that function as interference reflectors.

Turning now to the etalon structure, a schematic of the etalon 102 is shown in FIG. 2. The etalon 102 comprises in a pair of reflective thin-film dielectric stacks 202, 204, separated by a slab of transparent material 206 or an intervening air gap or a gap filled with a gaseous material, of dimension $d_0$. The stack layers 202, 204 represent either thin metallic or desirably broad band dielectric reflectors based on ¼ wave optical thickness layers of alternating high and low index material. The center wavelength for the dielectric reflector design would typically be chosen to be close to the center of the desired range of operating frequencies for the laser. The wavelength-discriminating power of the etalon 102 improves with the number of layers incorporated in the multilayer dielectric stack. The number of layers in each stack 202, 204 can range up to 50 or more, as desired.

Figure 3:
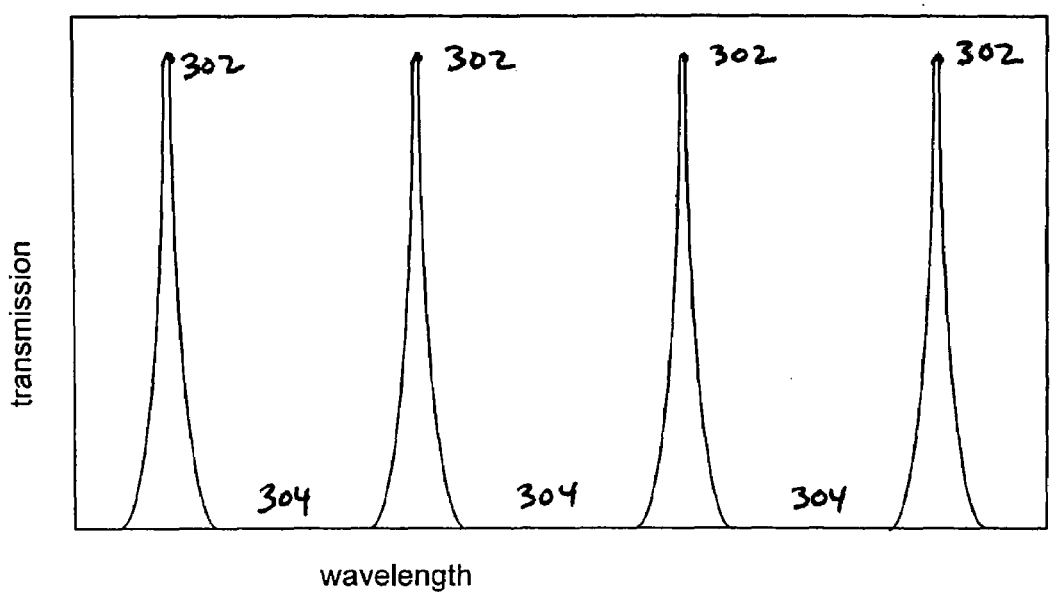
FIG. 3 shows a typical spectral transmission characteristic for an etalon.

Depending on the wavelength and angle of incident light, θ, the etalon 120 will either reflect or transmit incident radiation with a high level of contrast. This effect can be used to select wavelengths of incident radiation by transmitting certain wavelength ranges and reflecting other wavelength ranges. A typical transmission spectrum of the etalon 120 is shown in FIG. 3. The wavelength separation and width of the transmission bands, and the contrast between transmission peaks 302 and the reflection baseline 304 can be tailored to the specific needs of a given application. The transmission characteristics of the micromachined etalon 120 can be accurately modeled and computer-based simulations facilitate design optimization. Tuning of the micromachined etalon 120, i.e., changing the wavelength dependence of the transmission peaks of FIG. 3, can be effected in several ways. The separation between the dielectric stacks, $d_o$, can be varied. In the case of an etalon with an air gap, this can be done by altering the air gap separation distance, as illustrated in FIG. 1C. A second means of tuning is to tilt the etalon 120 with respect to the axis of the optical beam, which changes the angle of incidence, and correspondingly modifies the transmission of the beam through the micromachined etalon 120. Another means of etalon tuning is to have the gap 206 filled with a material whose refractive index can be modified, such as by the application of an electric field.

Turning now to the operation of the external cavity laser 100, the overall cavity optical path length figures prominently in calculating the lasers 100 performance. The effective optical path length $l_{eff}$ of a device can be defined as $$l_{eff} = \sum_i d_i \cdot n_i$$

where $d_i$ and $n_i$ are the thicknesses and refractive indices of components comprising the device. In the case of the etalon 120, this entails summing the products of the refractive index $n_i$ and layer thickness $d_i$ for each component layer i of the dielectric stacks, plus the product of the refractive index $n_0$ of the transparent slab or air (n=1) and the thickness $d_0$ of the slab or air gap(s), including each gap between physical elements. In the event a gel or encapsulant is used to fill the space between elements, then the refractive index of that material is used instead of n=1. More explicitly, for an etalon comprised of two dielectric stacks with a total of N layers, the effective optical path length $l_{eta,eff}$ of the etalon 120 is $$l_{eta,eff} = d_0 \cdot n_0 + \sum_{i=1}^{N} d_i \cdot n_i$$

With regard to the present invention and as will be explained, there is much incentive to minimize such optical path lengths, and doing so is enabled, by the microfabricated micromachined etalon 120 of the present invention.

The total optical path length of the optical cavity 103 $l_{cav,eff}$, determines the mode spacing of the laser. For a nominal emission wavelength $\lambda_0$, the wavelength spacing Δλ between adjacent emission modes is given approximately by $$\Delta\lambda \cong \frac{(\lambda_0)^2}{2 \cdot l_{cav,eff}}$$

Thus, shortening the optical cavity length $l_{cav,eff}$ yields more widely-spaced emission modes, i.e., Δλ increases. The mode spacing imposes constraints and demands on the method and devices of mode selection in that closely-spaced laser emission modes require a mode selection with high spectral resolution.

With regard to the present invention and referring to FIG. 1a-1c, the effective length $l_{cav,eff}$ of the optical cavity is $$l_{cav,eff} = d_{las} \cdot n_{las} + d_1 + d_{lens} \cdot n_{lens} + d_2 + l_{eta,eff} + d_3$$

where $d_{las}$ is the laser length as measured between the first and second end surfaces 104, 106 of lasing element 102, $n_{las}$ is the refractive index of the laser material, $d_{lens}$ is the thickness of the lens 116 on-axis, and $n_{lens}$ is the refractive index of the lens. The effective optical cavity length can be kept small by using microfabricated components for the lens(es) and etalon(s). By this means, miniaturized components and systems, in addition to their attractiveness for compact systems integration, also provide more latitude in tailoring the mode spacings of the external cavity laser 100.

The spacing of optical cavity modes and its relation to laser tuning is illustrated in FIGS. 4A-4C and FIGS. 5A-5H. FIG. 4a shows the gain spectrum 402 of the semiconductor laser 102. Photons generated by radiative transitions at wavelengths within the gain spectrum 402 can contribute to lasing if optical feedback is provided such that the internal gain of the lasing media exceeds optical losses. The optical cavity 103, considered in conjunction with the optical path of the lasing element 102, provides such feedback to sustain a discrete set or 'comb' of wavelength modes 404 (FIG. 4b) with mode spacing $\Delta\lambda$. The allowed optical cavity modes 404 that overlap the gain bandwidth 402 of the laser 102 determine the cavity laser emission wavelengths. The output spectra of the external cavity laser 100 is given by FIG. 4c which is a convolution of the spectra of FIGS. 4a and 4b. The solid line of FIG. 4d shows a transmission band spectral response 403 of an etalon, such as micromachined etalon 120 in FIG. 1, that serves to suppress all but one emission mode and thus produces a single-mode laser output 405 as shown in FIG. 4e. Note that it is desirable that the free spectral range (FSR), i.e., the distance between transmission peaks 403 of the wavelength-discriminating micromachined etalon 120, be larger than the laser gain bandwidth (as indicated in FIG. 4a), or else more than one lasing mode will be sustained. By the same token, the resolution bandwidth as measured by the full-width half maximum (FWHM) of micromachined etalon 120 must be sufficiently narrow to avoid selecting the adjacent laser modes 401 supported by the optical cavity 103, which occurs if insufficient suppression of the of modes 401 is not achieved with respect to the desired mode of operation to produce selective gain of the desired mode. The ratio of power between the desired mode and side modes can be measured as the side mode suppression ratio and acceptable values depend on the application. For many WDM applications they are from 20 to 45 dB.

In addition, the transmission pass band of the micromachined etalon 120 can be shifted to a new wavelength range by tilting the micromachined etalon 120 or adjusting the gap spacing, as explained in reference to FIGS. 1B and 1C. This shift is represented for example by the dashed line 403a of FIG. 4d, in which case a different mode of the laser 100 is selected, resulting in a laser emission output that is shifted to a corresponding emission wavelength 403a (dashed line in FIG. 4e). In this way, the laser system is discretely tunable in that distinct, well-separated wavelengths can be selected from among a well-defined, stable set of emission wavelengths assigned to WDM channels. It is noted that a degree of temperature stability is required and is determined by the allowable drift of the comb of possible operating modes. The allowable drift depends on the channel spacing and is different from CWDM and DWDM, and also different depending of the narrowness of the grid. For example a DWDM system designed for 50 GHz spaced channels will typically require more stability of operating wavelengths than a DWDM system designed for 200 GHz. The drift with temperature is primarily determined by the change in index with temperature of the lasing element 102, followed by the optical elements used in the system, along with the change in physical length of the substrate with temperature (CTE) on which the elements are assembled. Various methods to athermalize the comb of wavelengths can be employed such as building on low CTE substrated, incorporating low dN/dT optical elements, or incorporating compensating elements that have a negative dN/dT or negative CTE. Such construction techniques can optionally be employed if more than temperature control through, for example, a thermoelectric cooler, is required for the desired application.

Figure 4:
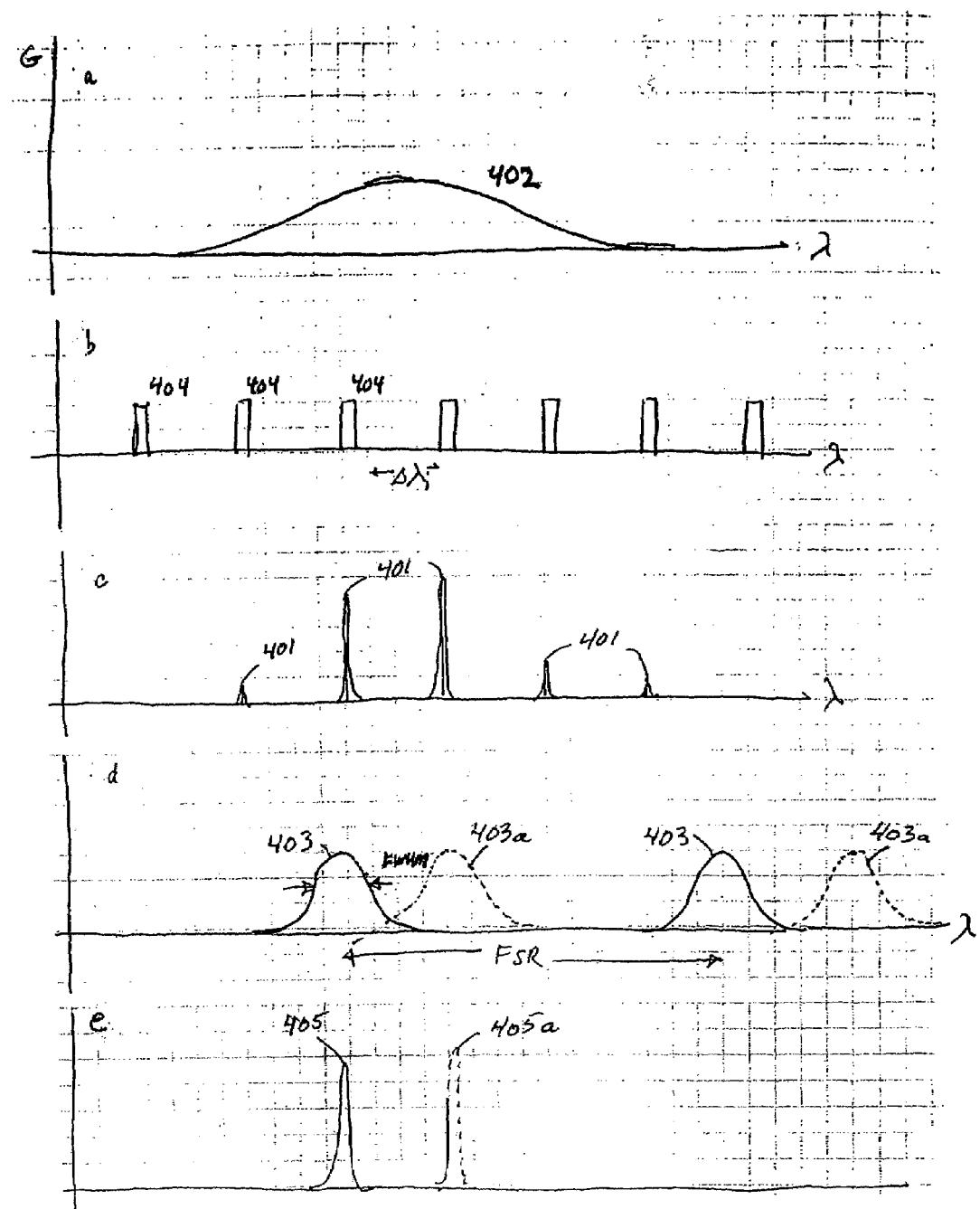
FIGS. 4a-4e shows relevant spectral characteristics for an external cavity edge-emitting laser particularly exemplifying the case of a relatively short external optical cavity length and resulting widely-spaced modes, and including: 4a the laser gain bandwidth, 4b the optical cavity modes, 4c the allowed laser emission modes, 4d, the spectral response for a particular setting of a mode selecting device, and 4e the selected laser emission output for the mode selection shown in 4d.
Figure 5:
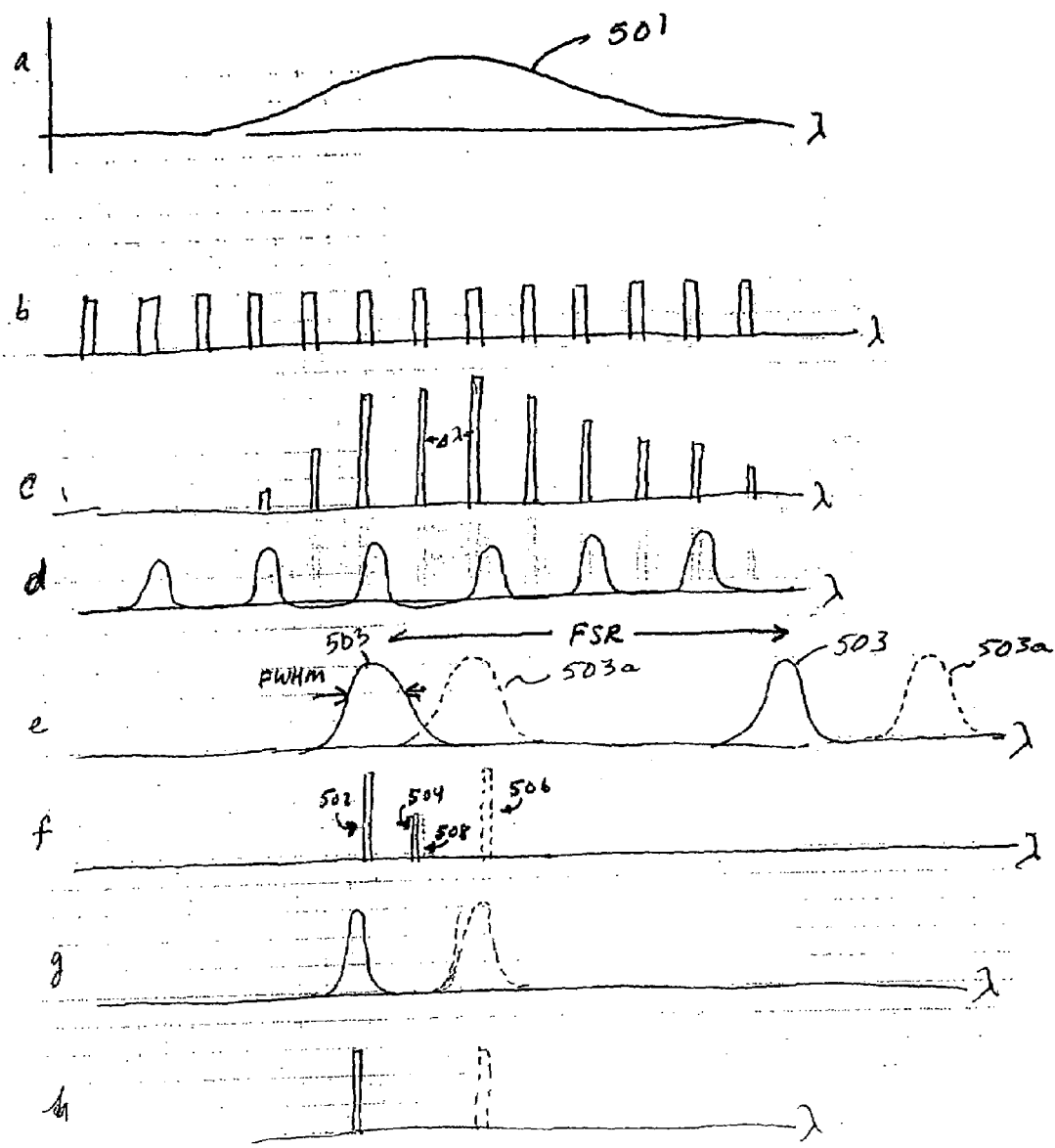
FIGS. 5a-5h shows relevant spectral characteristics for an external cavity edge-emitting laser particularly exemplifying the case of a relatively long external optical cavity length and resulting closely-spaced modes, and including: 5a the laser gain bandwidth, 5b the optical cavity modes, 5c the allowed laser emission modes, 5d a mode filter reducing the number of modes, 5e the spectral response for a particular setting of a mode selecting device with modest resolution, 6f the selected laser emission output from using the mode selector of 5e and showing the inadvertent selection of adjacent modes, 5g the spectral response for a particular setting of the mode selecting device with improved resolution relative to that shown in 5e, and 5h the laser emission output for the mode selection shown in 5g.

From the example described with respect to FIG. 4, the need for an etalon with sufficient spectral resolution to select a single cavity laser mode is indicated. As a counter example, FIG. 5 shows the case of an external cavity laser with more closely-spaced emission modes. As the mode spacing is approximately inversely proportional to the cavity length, closer mode is realized when the length of the external cavity 105 is increased from that shown in FIG. 4. An external optical cavity 105 with a length longer than that to which FIG. 4 pertains exhibits more densely spaced modes, as evident by comparing the allowed cavity modes of FIG. 5b with that of FIG. 4b. When the cavity modes are more closely spaced, i.e., $\Delta\lambda$ is reduced, the etalon 120 must have a greater discriminating capability, i.e., a sufficiently reduced FWHM, in order not to inadvertently select adjacent modes along with the mode targeted for selection. More explicitly, an etalon transmission response 503 having a FWHM which is broader than the optical cavity mode spacing will select more than one mode, as indicated by the two solid-line output emission peaks 502 and 504 of FIG. 5f. Similarly, when the etalon transmission band 503a is shifted to select another laser mode, an additional adjacent peak is inadvertently selected as indicated by the two dashed-line laser output peaks 506 and 508 in FIG. 5f. This problem might be remedied by using an etalon with greater discrimination, i.e., a narrower FWHM, as exemplified by a hypothetical etalon with transmission band spectral response indicated in FIG. 5g, which results in the single-mode laser output shown FIG. 5h. As before, the FSR of the wavelength selector must also be greater than the gain bandwidth of the laser to avoid selecting more than one mode with insufficient discrimination for the application.

Another approach to resolving closely-spaced modes is to insert an interference filter, etalon or similar type of wavelength-discriminating device into the external optical cavity 105 for the purpose of removing a subset of the modes. In effect, a less-dense comb of cavity modes is then realized. FIG. 5d shows an interference filter pass-band response that would attenuate, for example, every other cavity mode. The extra component would reduce the resolution requirements of the wavelength-discriminating mode selector, but at the expense of additional complexity, and further would also require an increased external optical cavity length in order to permit enough space for its insertion into the cavity. The ability to attain a tunable etalon with sufficient resolution to select a single laser mode, and moreover an etalon that does not require a lengthening of the external optical cavity in order to accommodate larger or additional mode-selection components (and thus exacerbating the mode resolution problem by creating more densely-spaced modes) is provided by the present invention.

Another aspect of the effective optical path length with regard to laser emission modes relates to etalon tuning. The process of tilting the micromachined etalon 120 or varying its gap distance, do, in order to modify its spectral transmission characteristics alters the effective optical path length of the external cavity 105. As a consequence, the laser emission wavelengths also shift. Ideally, this effect would be minimized in the interest of stabilizing the emission mode spectra, and a design criterion for the micromachined etalon 120 is to deemphasize the effect of etalon tuning actuations on the effective optical path length of the external cavity 105. This is readily achieved in designs incorporating the air gap instead of a solid dielectric in the etalon 120 since the gap 124 comprises a substantial portion of the optical path of the etalon, and thus the gap 124 does not contribute to a change in the total cavity path length as the etalon 120 is tilted. Optionally, feedback control, additional wavelength-locking etalons, or geometric adjustments can be incorporated to ameliorate these perturbing effects.

The present invention brings several important features to etalons 120 used for tuning external cavity lasers. First, the micromachined etalon 120 may be made by micromachining methods and so is relatively compact, as well as compatible with micro-optics assemblages. Second, the micromachined etalon 120 may be tuned by electro-mechanical effects wherein an electric voltage signal modulates the transmission characteristics of the micromachined etalon 120. Third, the optical path length of the micromachined etalon 120 may be relatively small compared to conventional etalons. Fourth, the contribution to a change in the total cavity optical path length by the micromachined etalon 120 with tuning is small. As discussed in the following, these features can be exploited to great advantage in application to mode selection of external cavity lasers.

For purposes of the present invention, it is desired that the micromachined Fabry-Perot etalon 120, be compact, with highly accurate, reproducible optical transmission characteristics, and further, that some facility be provided to tune the spectral transmission characteristics of the micromachined etalon 120 so that laser mode selection can be realized. Desirably, the tuning of the micromachined etalon 120 is under electrical control. To this end, the transmission characteristics of the micromachined etalon 120 are modulated, such as by one or more of several electro-mechanical effects, with the result that the wavelengths at which the transmission pass band(s) of the tunable micromachined etalon 120 are centered are functions of an applied voltage.

Figure 6A:
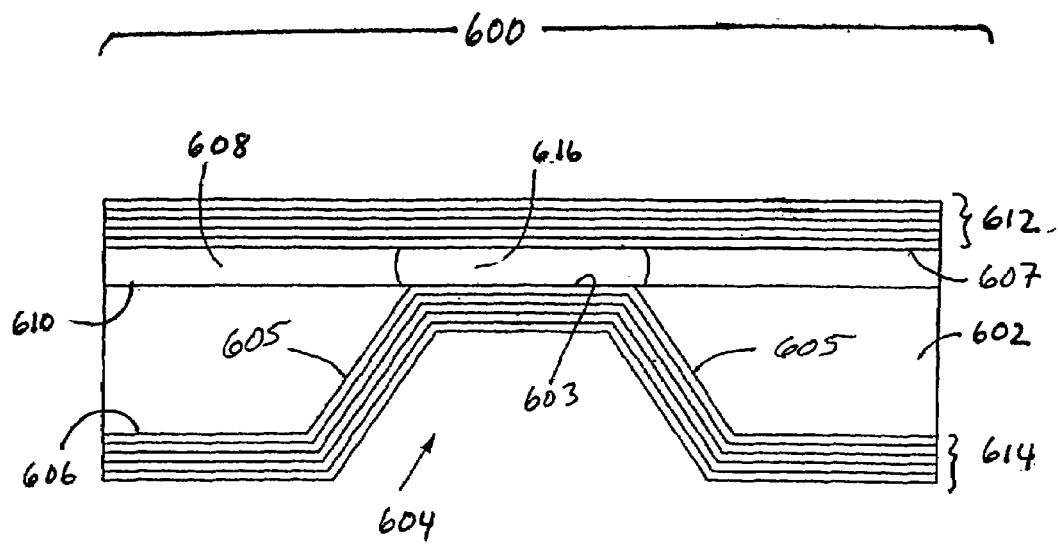
FIG. 6a schematically illustrates a micromachined etalon comprised of a substrate with a recess conformally coated on both sides with multilayer dielectric stacks.

A cross-sectional view of one specific etalon structure 600 in accordance with the present invention is shown in FIG. 6a. The etalon 600 may be fabricated in a plate or substrate 602, such as a silicon wafer of the type commonly used in the microelectronics industry. A recess 604 with beveled sidewalls 605 may be formed in one side of the substrate 602. This particular configuration would be typical of a cavity made by wet anisotropic etching in<100>silicon where the etching stops on an etch stop layer such as oxide or heavily doped silicon. Other means of etching such as deep reactive ion etching could be used. The side of the substrate 602 in which the recess 604 is formed will be referred to as the 'rear surface' 606 of the etalon. A spacer layer 608 made of material different from the substrate 602 is formed on the side of the substrate 602 opposite the recess 604. The exterior surface of the spacer layer 607 will be referred to as the 'front surface' 607 of the etalon 600. Multilayer thin-film stacks of dielectric coatings 612, 614 cover the front and rear etalon surfaces 607, 606, respectively. The front side coating 612 formed on the planar front surface of the substrate 602 is highly planar. The rear side coatings 614 are conformal and uniformly cover the recess sidewalls 605, base 603, and rear surface 606. An air gap 616 may be provided between the two dielectric stacks, 612, 614 centered over the recess 604. The air gap 616 may be created by etching the spacer layer 608 through etch holes formed in the top dielectric stack 612. The multilayer dielectric coatings 612, 614 may be composed with respect to number of layers, order of layers, refractive index of layers, and thicknesses of layers to function as dielectric reflectors, as is well-known in the art of thin-film optics and as is routinely exploited in the production of reflection and anti-reflection coatings on optical components, for example. For instance, the coatings 612, 614 may be comprised of alternating layers of silicon dioxide (refractive index of about 1.46) and silicon nitride (refractive index of approximately 2.0). The optical thicknesses, (i.e., the actual physical thickness multiplied by the refractive index of the layer material at the wavelength of interest) of the component layers of the interference filters may be made to correspond to one-quarter wavelength, or multiple thereof, of the laser light emission wavelength. Both the front and rear dielectric coatings 612, 614 may be deposited in the same process such that both the front and rear side coatings 612, 614 have very nearly the same optical properties and transmission characteristics. Suitable methods of depositing dielectric layers include thermal evaporation, electron-beam evaporation, sputtering deposition, and chemical vapor deposition. Chemical vapor deposition (CVD), including low-pressure CVD and plasma-enhanced CVD, and atomic layer deposition are attractive options, because they are conformal and can be used to deposit both front and rear coatings 612, 614 simultaneously. It will be seen that the structure of the micromachined etalon 120 of FIG. 6a embodies the basic features of an etalon shown in FIG. 2, namely two interference filters separated by an air gap or slab of transparent material.

Figure 6B:
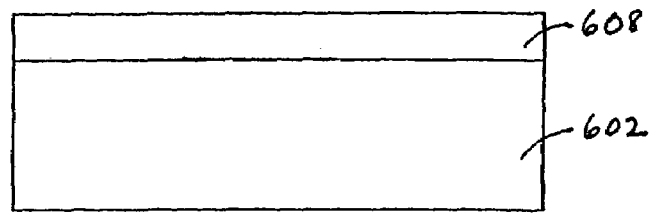
FIGS. 6b-6h schematically illustrate the sequence of fabrication steps used to make the micromachined etalon shown in FIG. 6a and including: 6b a substrate on which a spacer layer is formed, 6c a recess formed in said substrate, 6d conformal coatings of multilayer dielectric stacks formed on both surfaces of the etalon, 6e formation of holes for etching the spacer layer, 6f etching of the spacer layer to form an air gap, 6g top-plan view of micromachined etalon showing holes and area of spacer layer removal, 6h application of electrodes to actuate tuning by varying the air gap.
Figure 6C:
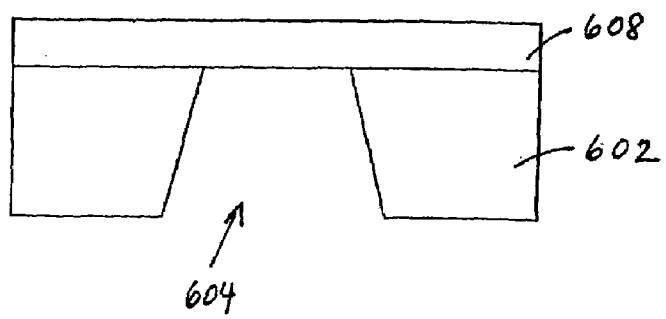
Figure 6D:
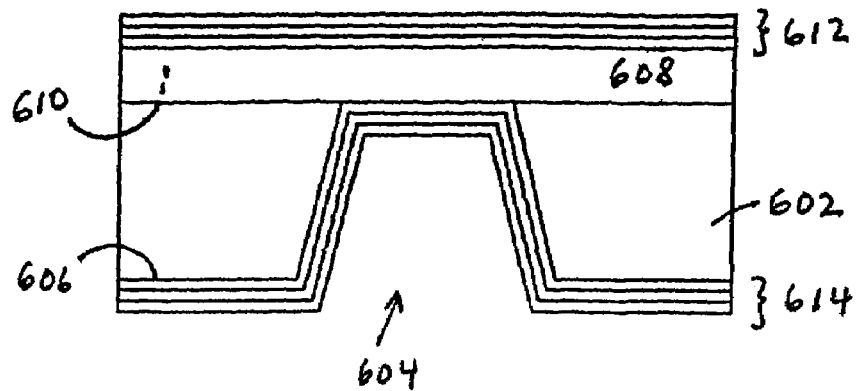
Figure 6E:
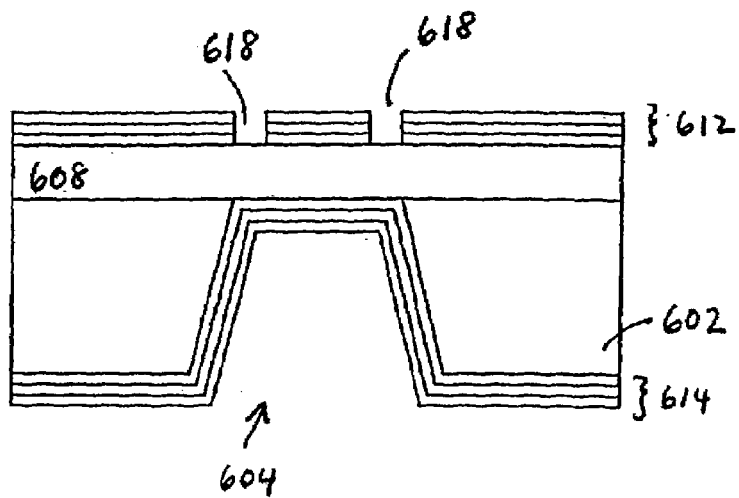
Figure 6F:
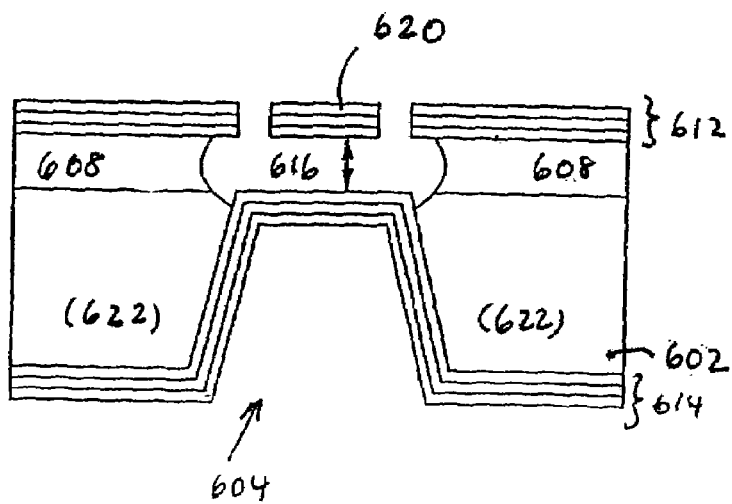
Figure 6G:
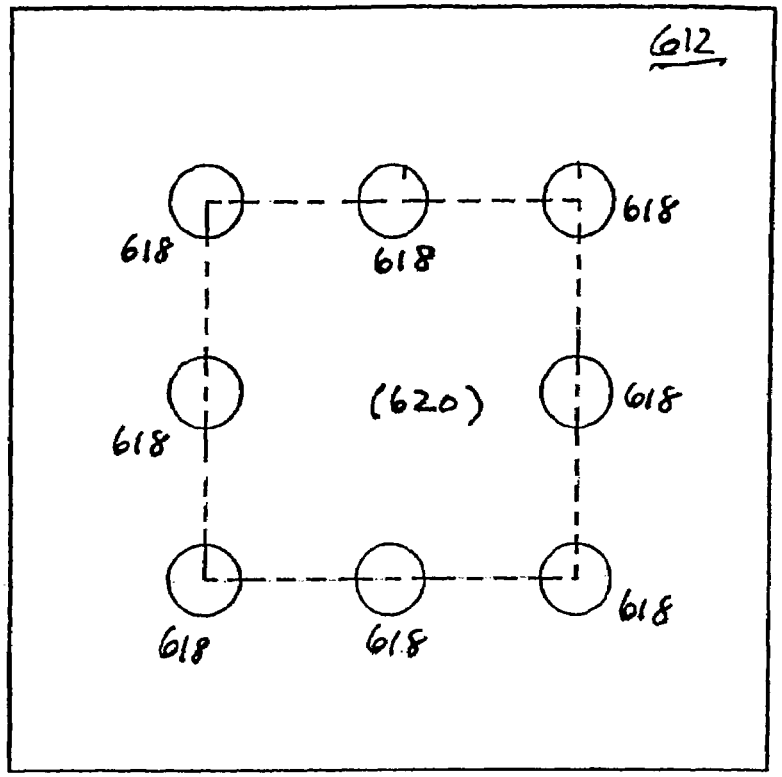
Figure 6H:
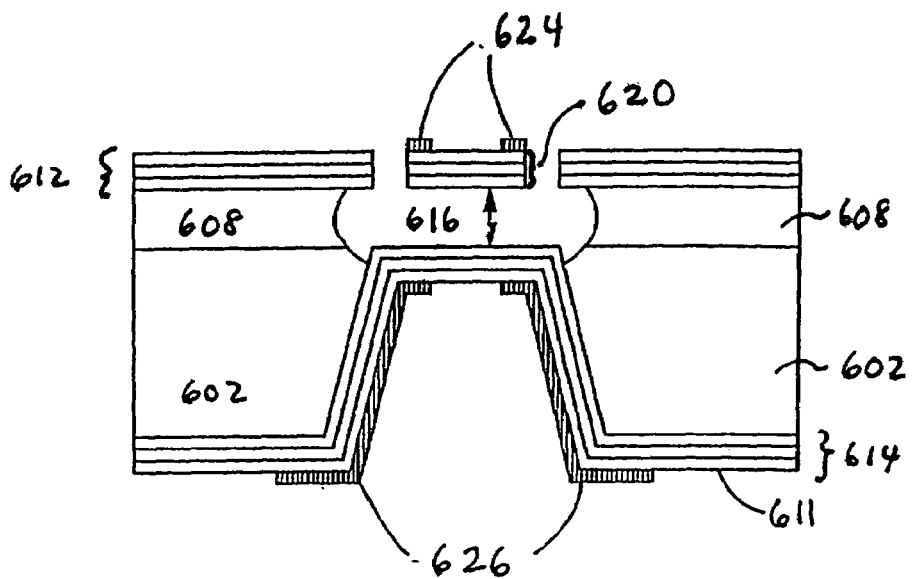

Turning now to the fabrication of the etalon 600, the present invention also provides a method of making the etalon 600 as shown by the sequence of steps depicted in FIGS. 6b to 6h. FIGS. 6a to 6f and FIG. 6h are cross-sectional side views, and FIG. 6g is a top-plan view. It will be understood that the techniques described here illustrate one sequence of steps that may desirably use established and convenient microfabrication technologies, but it will be apparent to those skilled in the art that there are many variations on these steps, and that alternatives to these steps can also produce structures with substantially the same properties and function.

In FIG. 6b, a spacer material layer 608 is deposited or otherwise formed on a substrate 602 such as a silicon wafer. A single-crystal silicon wafer, polished on both sides, is a good choice for the substrate 602 due to its surface smoothness and flatness, and controllable etching properties. Other candidate substrates include glass, ceramic, fused silica, quartz, or other types of semiconductor wafers. Typically the silicon substrate 602 will have a thickness of about 0.5 millimeters and the spacer layer 608 will have a thickness ranging from 2 microns to 30 microns. Alternatively, the substrate 602 may be a silicon-on-insulator (SOI) structure with a 0.1 to 2-micron thick buried silicon dioxide layer separating a ~0.5-mm thick silicon wafer from a 2- to 30-micron thick deposited silicon layer. It is noted that the substrate need not be transparent to laser wavelengths since formation of the recess 604 removes all substrate material from the optical path of the laser beam. A main criteria of materials selection is that the substrate material can be selectively etched with respect to the spacer layer material. Many material combinations fulfill this requirement including a boron- or other impurity-doped silicon spacer layer 608 deposited on undoped or lightly doped silicon substrate wafer as the substrate 602, or a silicon spacer layer 608 deposited on a sapphire substrate 602. In the former case, doping of the spacer layer 608 makes it resistant to etches that otherwise etch undoped or lightly-doped silicon.

In one desirable embodiment, the substrate 602 may be a single crystal silicon wafer and the spacer material 608 a heavily boron-doped silicon. The boron-doped silicon layer 608 can be formed by epitaxial growth, or ion-implantation of a boron-doped layer into the silicon wafer 602.

As shown in FIG. 6c, a recess 604, in the form of a tapered hole formed through the substrate 602, may be etched through the substrate 602, with the spacer layer, 608 acting as a stop-etch barrier (or the oxide provides the etch stop which is in contact with the spacer layer in the case of SOI silicon wafers). In the case of a silicon substrate 602, eg. (100) silicon, potassium hydroxide (KOH) solution can be used as an anisotropic etchant to provide the sidewall taper of the recess 604. Other silicon etchants that can be used for this purpose include hydrazine and EDP (ethylene diamine pyracatechol). Moreover, isotropic etchants can also be used, as would be typically the case with other substrate materials such as ceramics. A desirable property of the etchant is that it removes substrate material faster than spacer layer material. Alternatively, in the case of SOI wafers, selectivity of the etchant to the buried oxide layer is required. A typical diameter of the recess 604 at the spacer layer 608 is 100 to 500 microns, although this dimension can vary considerably according to the application and beam waist size of the lasing element 102 in the optical cavity 103.

As shown in FIG. 6d, a multilayer thin-film dielectric stack 612 forming an optical interference filter is formed on the front surface 607 of the substrate, and a dielectric stack 614 formed on the rear surface 606 of the substrate. Multilayers structures with alternating high and low refractive indices and of quarter-wavelength thickness can be designed and deposited according to methods widely used in thin-film optics. Layers may be comprised of, for example, silicon dioxide, silicon nitride, or other dielectric materials including metal oxides and wide-bandgap semiconductors such as gallium nitride or silicon carbide. A typical total thickness of the front- or rear-side dielectric stack may be 2 to 15 microns depending on the number of layers and the center wavelength for the design.

As shown in FIG. 6e, a set of holes 618 may be formed in the front dielectric stack 612. The holes expose the underlying spacer layer 608 making it accessible to etching. The holes 618 can be defined by photolithography in combination with wet or dry etching (e.g., reactive ion etching), or by other means such as laser drilling. The holes 618 can be located over the recess 604, or peripheral to the recess 604 and over the substrate 602. A typical hole diameter may be 10 to 50 microns. As shown in FIG. 6f, portions of the spacer layer 608 that lie directly over the recess 604 are removed by etching, leaving an air gap 616 between the front-side dielectric stack 612 and the rear-side dielectric stack 614, and wherein the gap 616 is aligned with the recess 604.

The so-described etching of the spacer layer 608 is feasible with several materials combinations for the substrate 602 and spacer layer 608, and with numerous formulations of etchants. If, for example, the spacer layer 608 is undoped or boron-doped silicon and the substrate 602 is silicon, the spacer layer 608 can be etched with xenon difluoride. Xenon Difluoride gas will readily isotropically etch silicon, but leave the substrate 602 unharmed as it is coated with layers of dielectric such as nitride and oxide. Liquid etchants may also be used. The etchant should not significantly etch or roughen the dielectric stack layers 612, 614, although some slight etching of the substrate 602 may be tolerable. As a result of etching a portion of the spacer layer 608, a portion 620 of the front-side dielectric stack layer 612 is suspended over the air gap 616.

A top-plan view of an exemplary hole pattern for etching the spacer layer 608 is shown in FIG. 6g for the case of eight holes 618 arranged around a square pattern. The dashed line rectangle of FIG. 6f shows the approximate extent of the area where two parallel dielectric stack reflectors 612, 614 are separated by the gap 616 excavated from the spacer layer 608 by etching. In FIG. 6g, the dashed line rectangle also approximately corresponds to a top-plan view of the portion of the front-side thin-film dielectric stack layer 612 suspended over the air gap 616 and denoted as 620 in FIG. 6f. This region serves as the optically functional part of the etalon 600, providing the optical interference effects for the laser beam. The unetched substrate portions that surround recess 604 (i.e., the area outside of the rectangular dashed line region in the top-view of FIG. 6g, or correspondingly the substrate portions denoted as (622) in the cross-sectional view of FIG. 6f, give the etalon 600 mechanical stability and also serve as a convenient handle for manipulating and mounting the etalon 600 in the optical cavity 103. The substrate 602 can also support mounting and alignment reference surfaces to facilitate accurate positioning and orientation of the etalon 600. Due to the geometric design of the micromachined etalon 600, relatively bulky parts of the substrate 602, as denoted by portions 622 peripheral to the recess 604 do not contribute to the optical path length of the etalon 600. In such a design, the net stress of the coated layers needs should be controlled with a net small tensile stress typically being desired.

The etalon 600 may be provided with additional structure to permit its tuning. As indicated in the cross-sectional schematic of FIG. 6h of an electrostatically actuated etalon 600, conductive electrodes 624 are formed on the exterior side of the front dielectric stack area 620 that is suspended over the air gap 616. This set of electrodes 624 are common, i.e., electrically connected. If the substrate 602 is sufficiently electrically conductive, it can function as a counter electrode. Alternatively, a counter electrode 626 in the form of a second conductive pad, such as comprised of a indium-tin oxide (ITO) layer, can be deposited on the exterior surface of the rear dielectric stack layer 614 as the counter electrode 626. Tin oxide and ITO has the advantage of being transparent at possible wavelengths of interest for fiber optic communication applications, and so obscuration of the optical path is avoided. A voltage applied between the electrodes 624 and counter electrode(s) 626 provides an electrostatic force that pulls or repels the suspended dielectric stack 620, thus varying the air gap 616 spacing between dielectric stacks 614 and 620. This changes the transmission characteristics of the etalon 600, and in particular, shifts the wavelengths of the narrow transmission bands (denoted by 302 in FIG. 3). This etalon structure thus provides modulation of the transmission bands, and thus in effect wavelength tuning, by an applied electric signal.

An alternative embodiment of an etalon 700 for use as the micromachined etalon 120 in the external cavity laser 100 is shown in FIG. 7d, with FIGS. 7a to 7d showing an exemplary sequence of steps in its fabrication. FIG. 7a shows a substrate 702 upon which a dielectric stack 704 is formed on one side 703. The dielectric stack 704 may be structurally, compositionally, and functionally similar to the dielectric stacks 612, 614 described with respect to FIG. 6. FIG. 7b shows a separate substrate 706 in which a shallow depression 708 has been formed in one side 705 of the substrate by masking and controlled etching or milling, and which same side 705 of the substrate has been conformally coated with a dielectric stack 710. As shown in FIG. 9c, the two substrates 702, 706 are aligned and fitted or bonded together such that the depression 708 provides an internal void or air gap 712 bounded on two sides by dielectric stacks 704 and 710. This structure provides an etalon 700 with air gap spacing, d, as indicated in FIG. 9c. As shown in FIG. 7d, portions of both substrates 702, 706 are removed to form aligned recesses 714 and 716, which reveals two free-standing dielectric stacks 718 and 720 bounding an air gap 712. As explained with respect to FIG. 6g, electrodes, either in the form of conductive pads or conductive oxide films can be applied to both free-standing stacks for electrostatic actuation and electrically controlled tuning of the etalon gap 712.

EXAMPLES

An significant feature of the invention is that the compactness of the micromachined etalon and the associated shortening of the optical path length of the optical cavity 103 facilitates more optimal mode spacing and simpler means of mode selection. These aspects of the invention further are embodied in the following modeling and simulation examples.

Figure 8A:
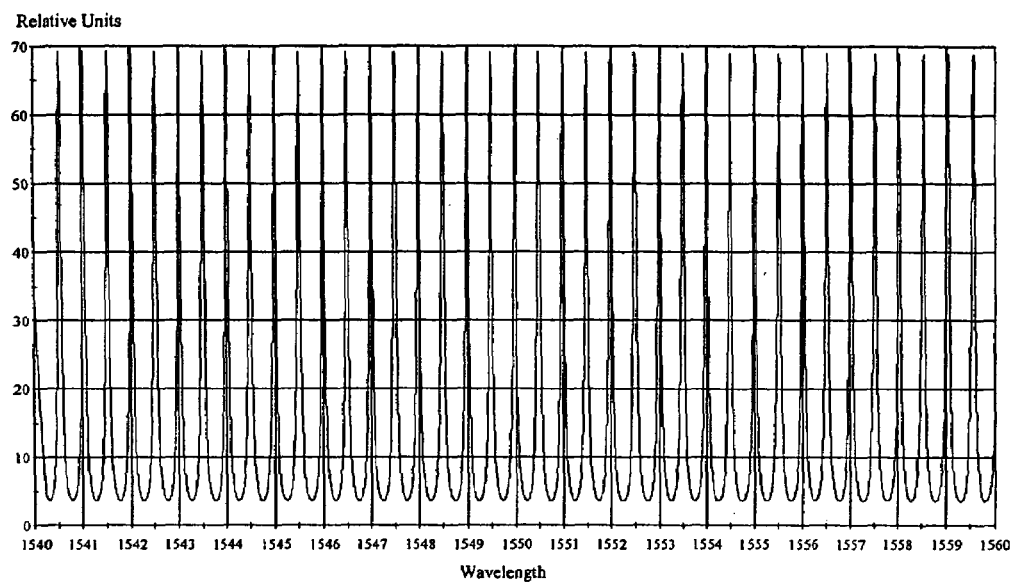
FIG. 8a illustrates a simulation showing modes for a 24-mm long Fabry-Perot optical cavity.
Figure 8B:
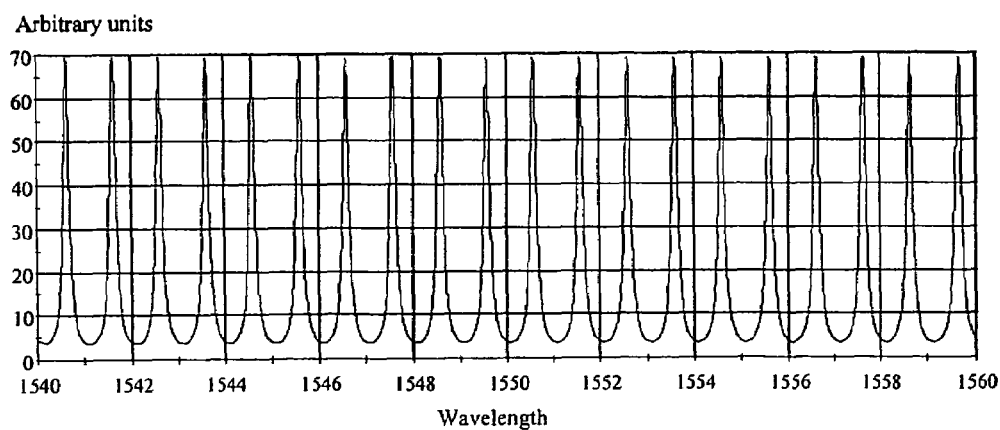
FIG. 8b illustrates a simulation showing modes for a 12-mm long Fabry-Perot optical cavity.

FIG. 8a shows the calculated comb of longitudinal wavelength modes for an effective total optical cavity length, $l_{cav,eff}$, of 24 mm in the spectral range centered at 1550 nm wavelength. The mode spacing is approximately 0.5 nm. FIG. 8b shows results from a similar simulation, but for a total optical path length of the laser cavity shortened to 12 mm. As anticipated, the mode spacing is increased from that of the first example to approximately 1 nm. FIGS. 8a and 8b illustrate the effect of optical cavity length on mode spacing, and that shorter optical cavities result in more widely spaced modes, requiring less stringent resolution requirements for a wavelength-discriminating, mode-selection device.

Figure 8C:
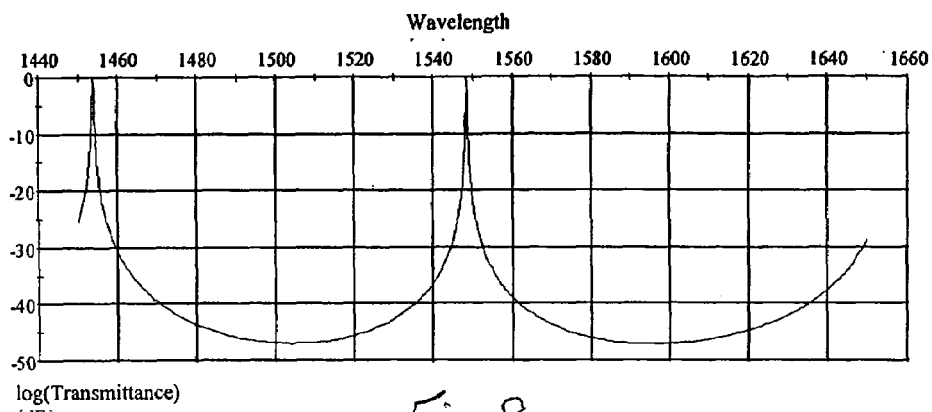
FIG. 8c illustrates a simulation showing the spectral transmission of a micromachined etalon.
Figure 8D:
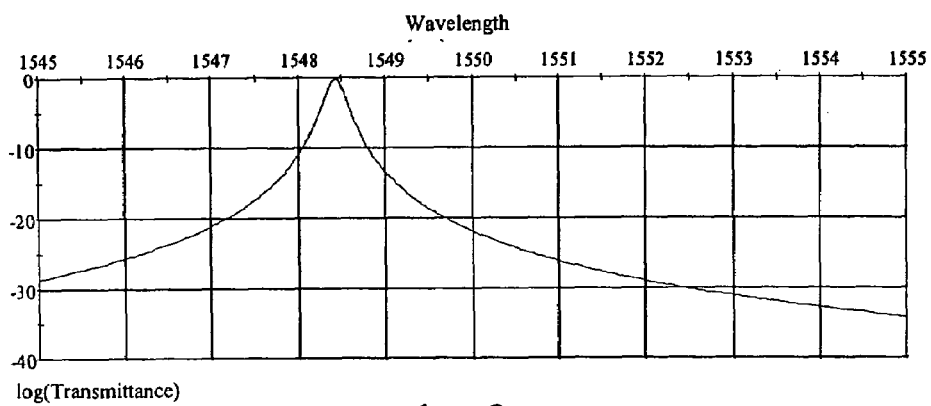
FIG. 8d illustrates a simulation showing a spectral transmission peak of a micromachined etalon in finer detail.

FIG. 8c (coarse detail) and FIG. 8d (finer detail) show the calculated spectral transmission of an etalon comprised of two dielectric stacks of 20 alternating layers of silicon nitride and silicon dioxide, each layer of quarter wave thickness (=λ/4n, where λ=1550 nm, and n is the refractive index appropriate for silicon dioxide or silicon nitride), separated by an air gap of 5.8 microns. The FWHM of a transmission pass band is approximately 0.3 nm. The FSR (free spectral range) of this etalon, i.e., wavelength spacing between adjacent transmission pass band peaks, is approximately 90 nm. This FSR is sufficiently larger than the gain bandwidth of typical 1550-nm wavelength emission lasers, a requirement stipulated in the discussions related to FIGS. 4 and 5 in order to avoid sustaining more than one laser mode. Further, the resolution of the exemplary microfabricated etalon is adequate to resolve the adjacent peaks for the case of a 12-mm long optical cavity. As seen in FIG. 8d, there is an approximate 15 dB attenuation for a modes within 1-nm of the peak transmission. All these examples are single pass calculations, whereas double pass would substantially increase the attenuation between pass bands. The required attenuation for a given application will depend on several variables, including the gain curve of the lasing element to be used. The suppression achieved can readily be adjusted by increasing or decreasing the number of layers in the dielectric reflectors.

Figure 8E:
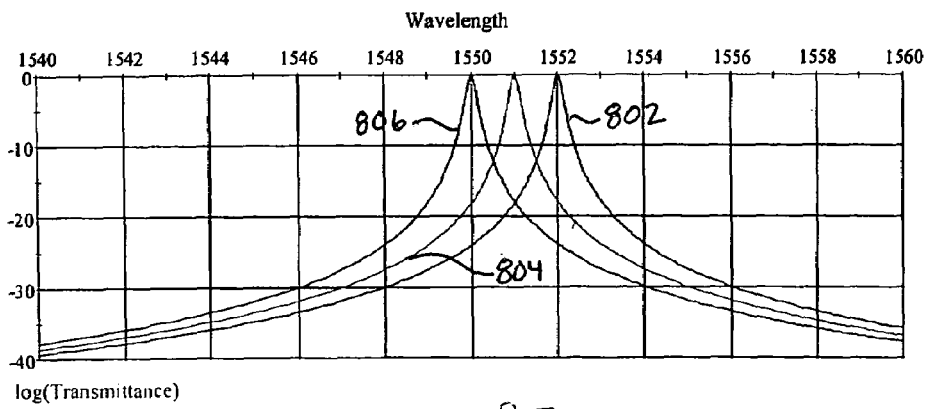
FIG. 8e illustrates a simulation showing the spectral transmission of a micromachined etalon wherein the air gap spacing is varied, resulting in a shift in transmission peak.

The potential tuning capability of the etalon described above with reference to gap adjustment is indicated by the three spectral transmission curves shown in FIG. 8e. A 5.8-micron air gap is shortened in increments of 8 nm, resulting in an appreciable shift of the transmission peak to shorter wavelengths shown as curves 802, 804, and 806, respectively. Curve 802 is for an etalon with a 5.820-micron gap. Curve 804 is for the gap shortened by 8 nm to 5.812-micron, and Curve 806 is for the gap further shortened to 5.804 microns. The simulation thus shows that a relatively modest modification of the air gap, as readily attainable by an electrostatic actuation effect, yields useful wavelength discrimination for mode spacings of 1 micron present in the optical cavity 103 with an effective optical length of 12 mm. Tilting the micromachined etalon 120 through angles of 1 to 35 degrees will yield a similar modification of transmission characteristics.

In one specific example of the present invention, typical contributions to optical path length may be:
  i. The edge-emitting laser 102 with physical length of $d_{las}$=250 microns, and an optical length of approximately 850 microns.
  ii. An anti-reflection coated ball lens 116 of 400 microns diameter, made of Spinel and having an optical path length of about 720 microns.
  iii. A tunable etalon 120 comprised of 10 to 20 layers of silicon nitride and silicon dioxide supported on a frame formed out of the peripheral regions of the wafer from which the etalon 120 is formed as shown in FIG. 6g for example. The resulting etalon optical path length is about 500 microns, and it should be noted that this thickness is based on the space allowed for insertion of the silicon wafer in which the etalon 120 is formed. As the laser beam path is confined to the recess formed in the silicon substrate, the optical path is not increased by transmission through silicon.

The spaces between these three elements (lasing element 102, etalon 120, and lens 116) can be made less than 1 millimeter in total.

Summing these optical paths as follows: 850 microns (laser)+720 microns (lens)+515 microns (etalon)+1 millimeters (gap spaces)=~3 millimeter, gives a minimum total optical path length of about 3 millimeters. Thus, the elements can be positioned with more relaxed or open spacing depending on the comb spacing desired.

Figure 9A:
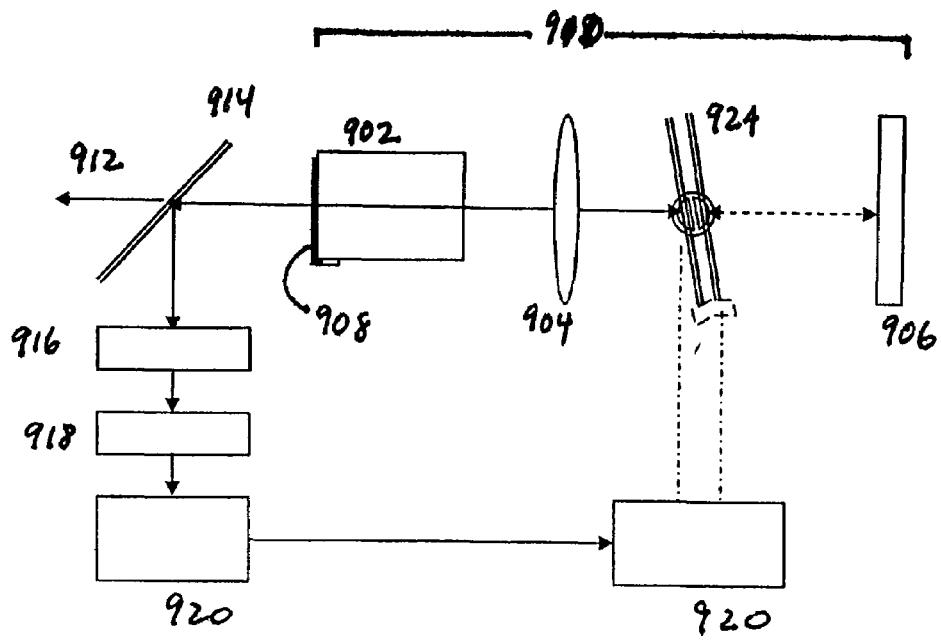
FIG. 9a schematically illustrates a tunable external optical cavity laser system with mode counting and selection capabilities.

The present invention also provides simple and accurate control of laser emission wavelength using a micromachined tunable etalon by monitoring laser output with a photodetector, of which one exemplary implementation is shown schematically in FIG. 9a. The system shown in FIG. 9a contains a laser 902, a collimating lens 904, along with a mirror 906 and a high reflectivity coated facet 908 that defines an optical cavity 910 there between. The laser beam output 912 is transmitted through the coated facet 908. The system also contains a beam splitter 914 disposed on the output beam 912, a photodetector 916 for receiving a split portion of the output beam 912, a pulse counter circuit 918, a controller 920, and a circuitry 922 to actuate a micromachined etalon 924. The photodetector 916 so arranged continually monitors the laser output. When the laser switches or hops between modes, there is a brief interruption in its optical output which can be detected and registered as a pulse. As the controller 920 sweeps the electrically actuated etalon through a spectral range, the counter circuit 918 can sense the occurrence of and count the number of mode hops which will imply the emission wavelength for a system with fixed wavelength emission modes. The detector 916 can then provide feedback to optimally position the etalon 924 for optimal power at the desired operating mode. The absolute positioning of the comb of modes can be set during the assembly process or by temperature tuning the system on a TEC to a temperature where the modes comb of longitudinal modes are centered as desired.

Figure 9B:
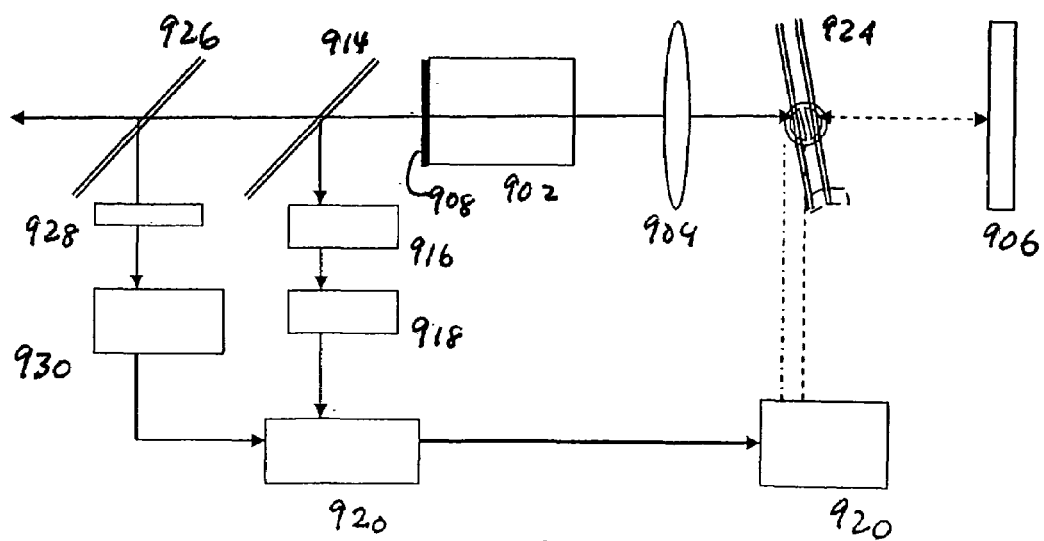
FIG. 9b schematically illustrates a tunable external optical cavity laser system with mode counting and selection capabilities and a means to sense a reference frequency to establish the laser emission mode.

In the system described by FIG. 9a, it is possible that some malfunction, noise effects, or other mishap will cause the mode hopping counter to lose track of the modes, resulting in a mode offset error. Alternatively, manufacturing variability in the total optical path length may produce variability on the start-up mode. This can be remedied by establishing a home channel wavelength which the system can use to establish a fixed reference point as shown in FIG. 9b. The system of FIG. 9b is similar to that of FIG. 9a with the addition of a second beam splitter 926, an optical filter 928 tuned to a 'home' channel, and a second photodetector 930. A diffraction grating, prism, etalon or similar device can serve in place of the optical filter 928. The second beam splitter 926 continually samples the laser output, which is filtered through a narrow-pass optical interference filter 928 that transmits only laser output of the reference wavelength to the second photodetector 930. A signal registered by the second photodetector 930 indicates the laser 902 is operating in the mode corresponding to the reference wavelength. The controller 920 can thus sweep through the modes, by actuating the etalon 924 with a ramp voltage and the number of modes traversed in the sweep can be counted by photodetector 916 and counting circuit 918. Thus, the laser 902 can be tuned to any desired mode can by counting the number of mode hops from the reference mode.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A method for fabricating a microfabricated etalon, comprising:
    providing a crystalline substrate having first and second opposing surfaces;
    providing a spacer layer over the first surface of the substrate, the spacer layer having an exterior surface;
    forming a hole extending through the substrate from the first surface to the second surface, the hole having a base adjacent an exposed portion of the spacer layer and a sidewall;
    providing a first interference filter over the exterior surface of the spacer layer and providing a second interference filter over the exposed portion of the spacer layer and the sidewall; and
    removing a portion of the spacer layer proximate the hole to provide a gap between the interference filters to provide an etalon between the interference filters.

2. A method for fabricating a microfabricated etalon according to claim 1, comprising providing a conductive electrode proximate the gap, the electrode configured to provide a repulsive or attractive force to change the gap spacing.

3. A method for fabricating a microfabricated etalon according to claim 1, wherein the forming of the hole comprises anisotropically etching the substrate.

4. A method for fabricating a microfabricated etalon according to claim 2, wherein the conductive electrode is disposed over the first interference filter.

5. A method for fabricating a microfabricated etalon according to claim 4, wherein the conductive electrode comprises a plurality of conductive electrodes over the first interference filter.

6. A method for fabricating a microfabricated etalon according to claim 4, further comprising forming a conductive electrode over the second interference filter.

7. A method for fabricating a microfabricated etalon according to claim 4, wherein the crystalline substrate is a silicon substrate.

8. A method for fabricating a microfabricated etalon according to claim 1, wherein the portion of the spacer layer is removed by etching through the spacer layer in a direction from the exterior surface.

9. A method for fabricating a microfabricated etalon according to claim 8, further comprising forming a plurality of holes in the first interference layer to expose the exterior surface of the spacer layer, wherein the portion of the spacer layer is removed by etching through the plurality of holes.

* * * * *